US 6,680,253 B2

(12) United States Patent
Wirth et al.

(10) Patent No.: US 6,680,253 B2
(45) Date of Patent: *Jan. 20, 2004

(54) APPARATUS FOR PROCESSING A WORKPIECE

(75) Inventors: Paul Z. Wirth, Whitefish, MT (US); Steven L. Peace, Whitefish, MT (US)

(73) Assignee: Semitool, Inc., Kalispell, MT (US)

( * ) Notice: Subject to any disclaimer, the term of this patent is extended or adjusted under 35 U.S.C. 154(b) by 150 days.

This patent is subject to a terminal disclaimer.

(21) Appl. No.: 09/907,522

(22) Filed: Jul. 16, 2001

(65) Prior Publication Data

US 2002/0017237 A1 Feb. 14, 2002

Related U.S. Application Data

(63) Continuation-in-part of application No. 09/437,711, filed on Nov. 10, 1999, now Pat. No. 6,423,642, which is a continuation-in-part of application No. PCT/US99/05676, filed on Mar. 15, 1999.
(60) Provisional application No. 60/116,750, filed on Jan. 22, 1999.

(51) Int. Cl.[7] ............................................. H01L 21/311
(52) U.S. Cl. ..................... 438/694; 438/694; 438/758; 438/906; 438/913; 438/780; 438/782; 134/153; 134/155; 118/723; 118/900
(58) Field of Search ................... 438/694, 758, 438/906, 913, 780–82; 118/715–23, 900; 134/153–155; 414/935–36

(56) References Cited

U.S. PATENT DOCUMENTS

| 3,727,620 A | 4/1973 | Orr |
| 3,953,265 A | 4/1976 | Hood |
| 4,132,567 A | 1/1979 | Blackwood |
| 4,439,243 A | 3/1984 | Titus |
| 4,439,244 A | 3/1984 | Allevato |
| 4,544,446 A | 10/1985 | Cady |
| 4,664,133 A | 5/1987 | Silvernail et al. |
| 4,750,505 A | 6/1988 | Inuta et al. |
| 4,790,262 A | 12/1988 | Nakayama et al. |
| 4,838,289 A | 6/1989 | Kottman et al. |
| 4,903,717 A | 2/1990 | Sumnitsch |
| 4,982,215 A | 1/1991 | Matsuoka |
| 4,982,753 A | 1/1991 | Grebinski, Jr. et al. |
| 5,020,200 A | 6/1991 | Mimasaka et al. |
| 5,032,217 A | 7/1991 | Tanaka |
| 5,117,769 A | 6/1992 | DeBoer |

(List continued on next page.)

FOREIGN PATENT DOCUMENTS

| JP | 59-208831 | 11/1984 |
| JP | 60-137016 | 7/1985 |
| JP | 61-196534 | of 1986 |
| JP | 62-166515 | 7/1987 |
| JP | 63-185029 | 7/1988 |
| JP | 1-120023 | 5/1989 |
| JP | 4 94537 | 3/1992 |
| JP | 5-13322 | 1/1993 |
| JP | 5-21332 | 1/1993 |
| JP | 5-326483 | 12/1993 |
| JP | 6-45302 | 2/1994 |
| JP | 52-12576 | 1/1997 |
| JP | 1-283845 | 11/1999 |
| WO | WO99/46065 | 9/1999 |

Primary Examiner—Matthew Smith
Assistant Examiner—Granvill D Lee, Jr.
(74) Attorney, Agent, or Firm—Perkins Coie LLP

(57) ABSTRACT

A system for processing a workpiece includes a base having a bowl or recess for holding a liquid. A process reactor or head holds a workpiece between an upper rotor and a lower rotor. A head lifter lowers the head holding the workpiece into contact with the liquid. The head spins the workpiece during or after contact with the liquid. The upper and lower rotors have side openings for loading and unloading a workpiece into the head. The rotors are axially moveable to align the side openings.

35 Claims, 14 Drawing Sheets

U.S. PATENT DOCUMENTS

| | | |
|---|---|---|
| 5,168,886 A | 12/1992 | Thompson et al. |
| 5,209,180 A | 5/1993 | Shoda et al. |
| 5,222,310 A | 6/1993 | Thompson et al. |
| 5,224,503 A | 7/1993 | Thompson et al. |
| 5,224,504 A | 7/1993 | Thompson et al. |
| 5,349,978 A | 9/1994 | Sago et al. |
| 5,361,449 A | 11/1994 | Akimoto |
| 5,421,893 A | 6/1995 | Perlov |
| 5,431,421 A | 7/1995 | Thompson et al. |
| 5,445,172 A | 8/1995 | Thompson et al. |
| 5,513,594 A | 5/1996 | McClanahan et al. |
| 5,551,986 A | 9/1996 | Jain |
| 5,591,262 A | 1/1997 | Sago et al. |
| 5,616,069 A | 4/1997 | Walker et al. |
| 5,666,985 A | 9/1997 | Smith, Jr. et al. |
| 5,677,824 A | 10/1997 | Harashima et al. |
| 5,678,116 A | 10/1997 | Sugimoto et al. |
| 5,718,763 A | 2/1998 | Tateyama et al. |
| 5,762,708 A | 6/1998 | Motoda et al. |
| 5,762,751 A | 6/1998 | Bleck et al. |
| 5,779,796 A | 7/1998 | Tomoeda et al. |
| 5,815,762 A | 9/1998 | Sakai et al. |
| 5,845,662 A | 12/1998 | Sumnitsch |
| 5,860,640 A | 1/1999 | Marohl et al. |
| 5,868,866 A | 2/1999 | Maekawa et al. |
| 5,882,433 A | 3/1999 | Ueno |
| 5,885,755 A | 3/1999 | Nakagawa et al. |
| 5,916,366 A | 6/1999 | Ueyama et al. |
| 5,942,035 A | 8/1999 | Hasebe et al. |
| 5,997,653 A | 12/1999 | Yamasaka |
| 6,423,642 B1 * | 7/2002 | Peace et al. ................ 438/694 |

\* cited by examiner

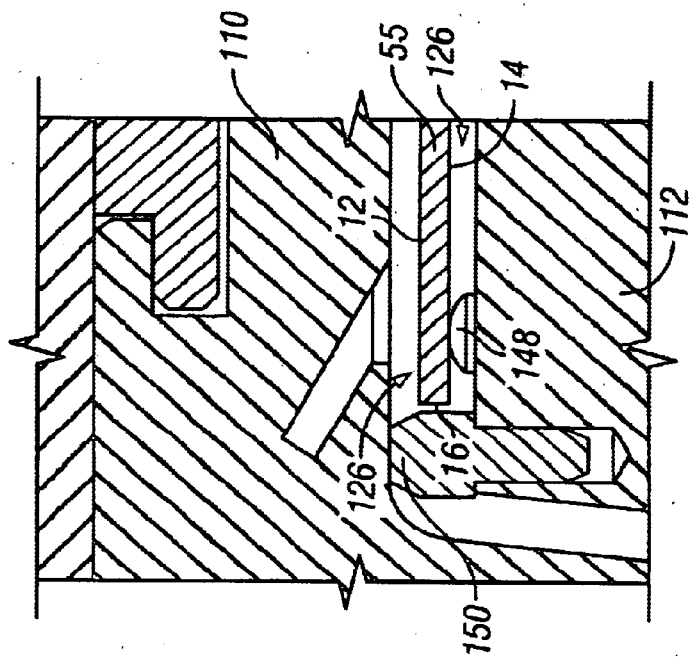
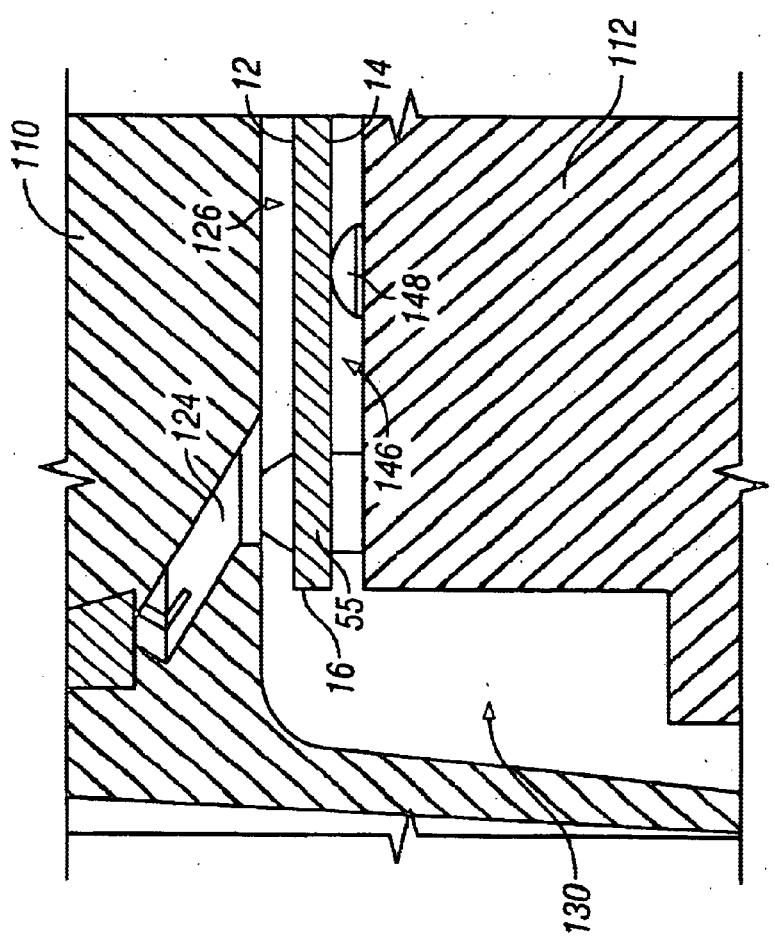

APPARATUS FOR PROCESSING A WORKPIECE

This application is a Continuation-In-Part of: U.S. patent application Ser. No. 09/437,711, filed Nov. 10, 1999 and now U.S. Pat. No. 6,423,642, which is a Continuation-In-Part/U.S. National Phase of International Patent Application No. PCT/US99/05676, filed Mar. 15, 1999, and now pending; which is a Continuation-In-Part of U.S. Patent Application Ser. No. 60/116,750 filed Jan. 22, 1999, and now abandoned. Priority to these applications is claimed and these applications are incorporated herein by reference. This application also incorporates by reference U.S. patent application Ser. No. 09/097,484 now U.S. Pat. No. 6,548,411; Ser. No. 09/907,524 now U.S. Pat. No. 6,511,914 and Ser. No. 09/907,552 now U.S. Pat. No. 6,492,284, all filed Jul. 16, 2001.

The invention relates to surface preparation, cleaning, rinsing and drying of workpieces, such as semiconductor wafers, flat panel displays, rigid disk or optical media, thin film heads, or other workpieces formed from a substrate on which microelectronic circuits, data storage elements or layers, or micro-mechanical elements may be formed. These and similar articles are collectively referred to here as a "wafer" or "workpiece".

BACKGROUND OF THE INVENTION

The semiconductor manufacturing industry is constantly seeking to improve the processes used to manufacture microelectronic circuits and components, such as the manufacture of integrated circuits from wafers. The objectives of many of these improved processes are decreasing the amount of time required to process a wafer to form the desired integrated circuits; increasing the yield of usable integrated circuits per wafer by, for example, decreasing contamination of the wafer during processing; reducing the number of steps required to create the desired integrated circuits; and reducing the costs of manufacture.

In the processing of wafers, it is often necessary to subject one or more sides of the wafer to a fluid in either liquid, vapor or gaseous form. Such fluids are used to, for example, etch the wafer surface, clean the wafer surface, dry the wafer surface, passivate the wafer surface, deposit films on the wafer surface, etc. Controlling how the processing fluids are applied to the wafer surfaces, is often important to the success of the processing operations.

Various machines and methods have been used for carrying out these manufacturing processes. However, existing machines have several disadvantages. These disadvantages include relatively large consumption of process chemicals and water. This consumption of process chemicals increases manufacturing costs, which ultimately increases the cost of the final product, such as e.g., computers, cell phones, and virtually all types of consumer, industrial, commercial and military electronic products. In addition, many process chemicals are toxic and require special handling, storage, and disposal methods. These can be costly and difficult, but are necessary for health, safety and environmental reasons. Consequently, reducing consumption of process chemicals has many advantages.

Reducing consumption of water is also beneficial. In many areas, water is becoming increasingly scarce. Due to population growth, there is greater competition for water. Disposing of waste water in environmentally friendly ways has also often become more difficult or costly. Accordingly, reducing water consumption in the manufacturing process is also important.

Generally, the microelectronic circuits now used in virtually all electronic products are manufactured from flat round disks or wafers made of a semiconductor material, such as silicon. The side or suface of the wafer having the microelectronic circuits is called the device side. The other side is often referred to as the back or bottom side of the wafer. In a fab or manufacturing facility, special machines or robots and techniques are used in moving, handling and storing wafers, to maintain the wafers in an ultra-clean environment. With these techniques, the wafers are uniformly delivered to each process machine in a device side up orientation. This works well for the majority of process steps. However, for some process steps, receiving the wafer in a device side down orientation would be desirable. For example, if the device side is to be processed with a liquid, having the device side down helps to remove the liquid via gravity, a feature not available with device side up processing. While flipping the wafer over from a device side up to a device side down orientation may conceptually be a simple event, in practice it presents substantial engineering challenges. Initially, the wafer typically can only be picked up at the edges, and no other part of the wafer may be touched (to reduce contamination). In addition, the wafer must of course be securely gripped or held before it is flipped over. The flipping over or inverting step must be performed in a small amount of space, since space is scarce and costly in the clean room areas of fabrication facilities. Moreover, the flipping step must be performed quickly, to avoid slowing manufacturing operations, and with a minimum of movements or transfers of the workpiece.

In many process manufacturing steps, the process chemicals used should be applied evenly onto the wafers, to avoid having too much or too little etching, film removal, etc. Existing machines often are not able to sufficiently uniformly apply process chemicals. This can result in lower yields. Moreover, many existing machines try to compensate for variations in applying process chemicals by using larger amounts of process chemicals. This inefficient use of process chemicals leads to the disadvantages described above. Accordingly, improved machines and methods which provide improved yield, consume less process chemicals and water, provide more versatility, and offer better results in performing manufacturing operations, are needed.

SUMMARY OF THE INVENTION

Machines and methods have now been invented which overcome the disadvantages described above. In one design, the machine includes a workpiece housing having a processing chamber. Processing fluids are distributed across the surface of the workpiece in the processing chamber, by centrifugal force.

In a first aspect, the machine has a head having a first rotor and a second rotor engageable with the first rotor to hold a workpiece between them. The second rotor preferably has an open central area, to expose a bottom surface of the workpiece. The exposed bottom surface of the workpiece is contacted with a liquid via fixed or moving spray nozzles or liquid applicators, or by contact with a bath of liquid. With this design, consumption of process chemicals and water is dramatically reduced. Distribution of the process chemicals on the workpiece is controlled by the rotors, resulting in more uniform and efficient processing. Multiple process steps can also be performed in the machine, reducing the potential of loss of the workpiece due to contamination, and expediting manufacturing steps.

In a second and separate aspect, the first and second rotors each have a chamber access opening. The first and second rotors are moveable relative to each other to at least partially align the openings, for loading and unloading a workpiece. The first and second rotors are also moveable relative to each other, so that the access openings are not aligned during processing of the workpiece. Preferably, the head includes at least one actuator for moving at least one of the rotors in a direction parallel to the spin axis of the rotors. This design allows workpieces to be more quickly and easily loaded into and unloaded from the machine.

In a third aspect, the head is attached to a support arm on a head lifter, for vertically moving the head towards and away from a base having a liquid source for applying liquid to a bottom surface of the workpiece. The liquid source may be a bowl containing the liquid, optionally including a sonic energy source, such as a mega sonic transducer. This design provides a versatile machine which can perform more types of processing steps, including flipping the workpiece to perform device side down processing.

In a fourth and separate aspect, in a method for processing a workpiece, the workpiece is moved horizontally into a process head. The head and workpiece are inverted and lowered down towards a liquid source which provides a liquid onto the bottom surface of the workpiece. Liquid is applied to the bottom surface of the workpiece, by direct contact with a bath of liquid, or via a liquid outlet, by spraying, or by immersion. The workpiece is rotated during or after liquid is applied to the bottom surface of the workpiece. A same, or a different liquid, or a gas or vapor, is optionally introduced to the top surface of the workpiece. This method provides a variety of process steps, with less process chemical and water consumption. It also requires less need for movement of the workpiece, reducing manufacturing time and space requirements.

Accordingly, it is an object of the invention to provide improved methods and apparatus for processing a workpiece. The invention resides as well in subcombinations of the steps and features described. The features described and illustrated in connection with one embodiment may or course be used in other embodiments as well.

BRIEF DESCRIPTION OF THE DRAWINGS

In the drawings, the same element number is used to designate the same element in all of the views.

FIGS. 5 and 6 are further enlarged details of features shown in FIG. 3.

DETAILED DESCRIPTION OF THE INVENTION

Figure 1:
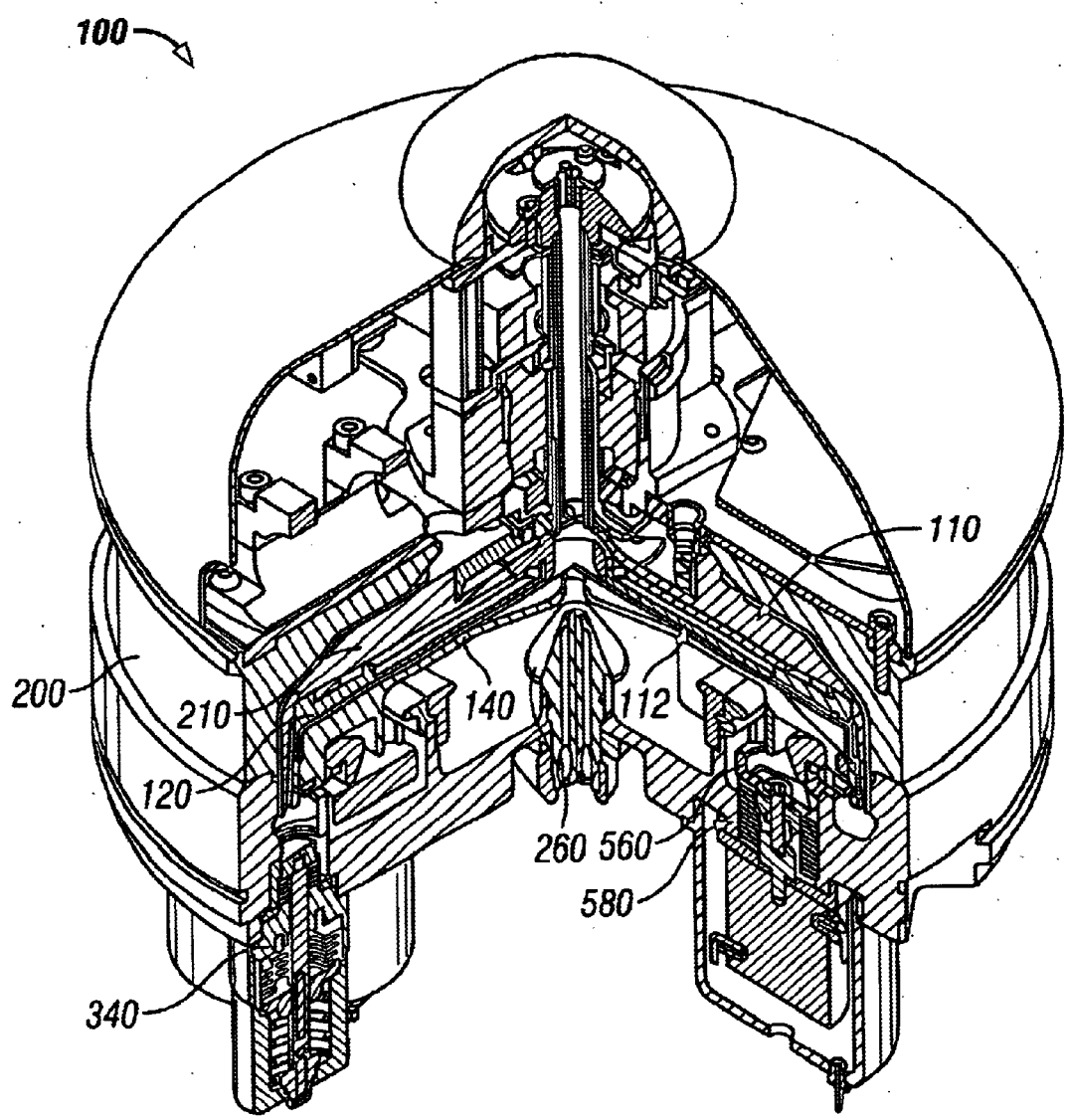
FIG. 1 is a cut-away perspective view of a reactor or machine for processing a workpiece.

With reference to FIGS. 1–8, a reactor 100 is provided for processing a microelectronic workpiece, such as a silicon wafer 55 having an upper side 12, a lower side 14, and an outer, circular perimeter 16, in a chamber. For certain applications, the upper side 12 is the front side, which may be otherwise called the device side, and the lower side 14 is the back side, which may be otherwise called the non-device side. However, for other applications, the workpiece 55 is inverted.

The reactor 100 has an upper chamber member or rotor 110 having an upper or chamber wall 120 and a lower chamber member or rotor 112 that includes a lower chamber wall 140. These walls 120 and 140 can move apart to allow a workpiece 55 to be loaded into the reactor 100 for processing, by a loading and unloading mechanism (not shown) that, for example, may be in the form of a robot having an end effector. The walls 120 and 140 are arranged to move together to form a chamber 160 around the wafer 55 in a processing position.

The reactor 100 is rotatable about an axis A. A head 200 contains the upper rotor 110, which includes the upper chamber wall 120. A motor 220 is provided for rotating the upper rotor 110. The upper rotor 110 drives the lower rotor, so that when they are engaged, in the closed position, the upper rotor, lower rotor, and the workpiece all rotate together. The motor 220 drives a sleeve 222, which is supported radially in the head 200, by rolling-element bearings 224. The head 200 is lifted up for opening or separating the walls 120 and 140, and lowered for engaging the walls 120 and 140 or bringing them towards each other.

The upper chamber wall 120 has an inlet 122 for processing fluids, which may be liquid, vapors, or gases. The lower chamber wall 140 also has an inlet 142 for such fluids. The fluids provided through the inlets 122 and 142 may be similar fluids or different fluids. The head 200 includes an upper nozzle 210 which extends axially through the sleeve 222, so as not to interfere with the rotation of the sleeve 222. The upper nozzle 210 directs streams of processing fluids downwardly through the inlet 122 of the upper chamber wall 120 in the upper rotor.

The upper chamber wall 120 includes an array of similar outlets 124 spaced apart preferably at uniform angular spacings around the vertical axis A. In the design shown, thirty-six such outlets 124 are used. The outlets 124 are spaced outwardly from the vertical axis A by just slightly less than the workpiece radius. The outlets 124 are also spaced inwardly from the outer perimeter 16 of a workpiece 55 supported in the processing position by a much smaller radial distance, such as a distance of approximately 1–5 mm.

When the upper and lower rotors are brought together, the chamber walls 120 and 140 form a micro-environment chamber 160. This chamber 160 includes an upper processing chamber section 126 defined by the upper chamber wall 120 and by a first or upper generally planar surface of the wafer 55. The chamber 160 also includes a lower processing chamber or section 146 defined by the lower chamber wall 140 and a second or bottom generally planar surface of the supported wafer opposite the first side. The upper and lower processing chambers 126 and 146, are connected or in fluid communication with each other via an annular region 130 beyond the outer perimeter 16 of the wafer 55. When brought together, the upper and lower rotors forming the chamber 160, are sealed by an annular, compressible seal (e.g. O-ring) 132 around lower rotor 112. The seal 132 allows processing fluids entering the lower inlet 142 to remain under sufficient pressure to flow toward the outlets 124.

Figure 3:
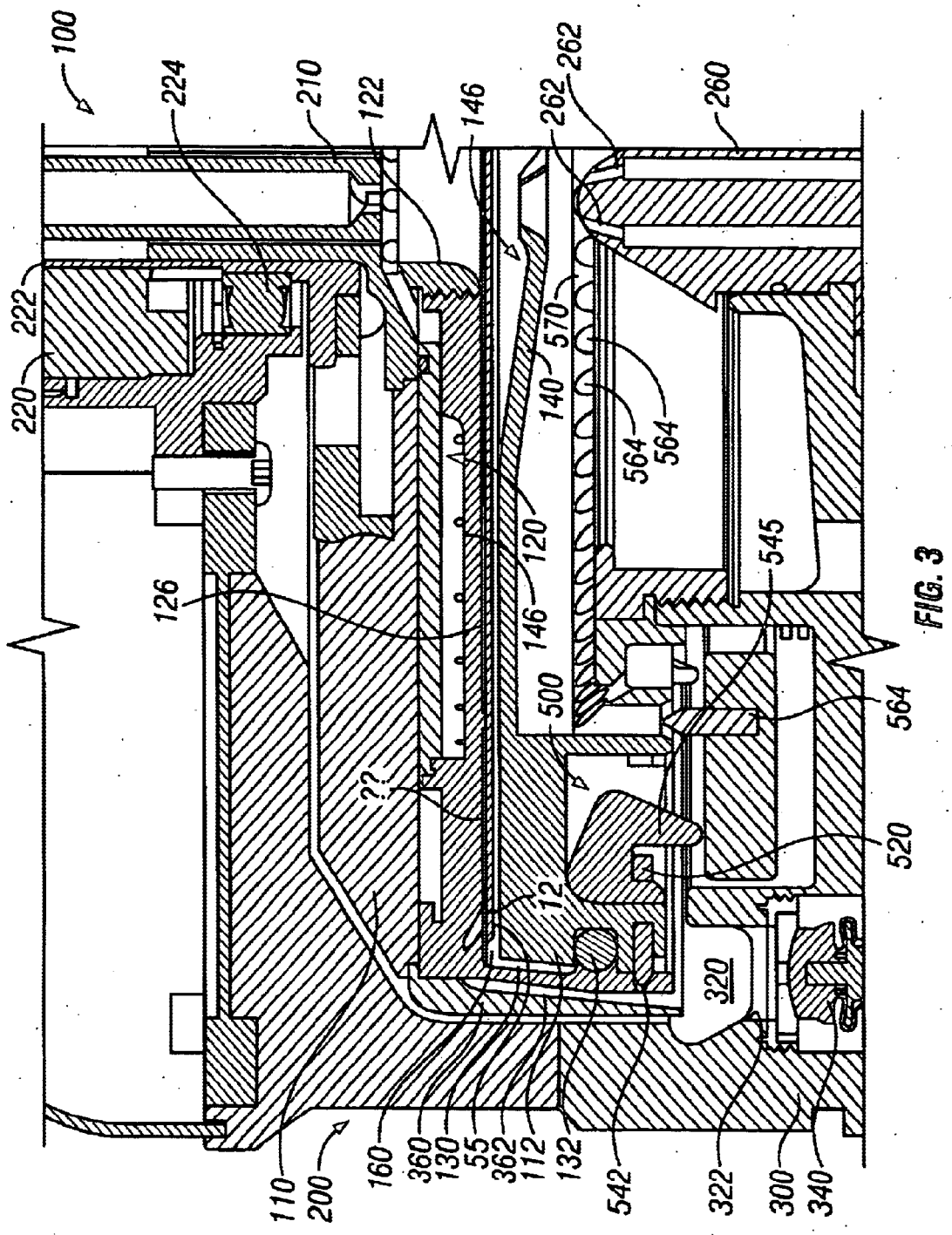
FIG. 3 is an enlarged detail of certain elements of the reactor of FIG. 1.

As illustrated in FIG. 3, the lower nozzle 260 is provided beneath the inlet 142 of the lower chamber wall 140, includes two or more ports 262. These direct two or more streams of processing fluids upwardly through the inlet 142. The ports 262 are oriented so as to cause the directed streams to converge approximately where the directed streams reach the lower surface of the wafer 55. The reactor 100 also preferably includes a purging nozzle 280, at a side of the lower nozzle 260, for directing a stream of purging gas, such as nitrogen, across the lower nozzle 260.

The reactor 100 may have a base 300 supporting the lower nozzle 260 and the purging nozzle 280 and which defines a coaxial, annular plenum 320. The plenum 320 has several (e.g. four) drains 322 (one shown). Each drain is pneumatically actuated via a poppet valve 340 for opening and closing the drain 322. These drains 322 provide separate paths for conducting processing liquids of different types to appropriate systems (not shown) for storage, disposal, or recirculation.

An annular skirt 360 on the upper rotor 210 extends around and downwardly from the upper chamber wall 120, above the plenum 320. Each outlet 124 is oriented to direct processing fluids exiting such outlet 124 through fluid passages 364 against an inner surface 362 of the annular skirt 360. The inner surface 362 is flared outwardly and downwardly, as shown. This causes processing fluids reaching the inner surface 362 to flow outwardly and downwardly toward the plenum 320, via centrifugal force when the rotors are rotated. Thus, processing fluids tend to be swept through the plenum 320, toward the drains 322.

The upper rotor 110 has a ribbed surface 215 facing and closely spaced from a smooth lower surface of the head 200, in an annular region 204 communicating with the plenum 320. When the upper rotor 110 rotates, the ribbed surface 215 tends to cause air in the annular region 204 to swirl. This helps to sweep processing fluids through the plenum 320, toward the drains 322.

The upper chamber wall 120 has spacers 128 that project downwardly to prevent the lifting of wafer 55 from the processing position and from touching the upper chamber wall 120. The lower chamber wall 140 has spacers 148 that project upwardly for spacing a wafer 55 above the lower chamber wall 140. Posts 150 project upwardly just beyond the outer perimeter 16 of a wafer 55 to prevent the wafer 55 from shifting off center from the vertical axis A.

Figure 8:
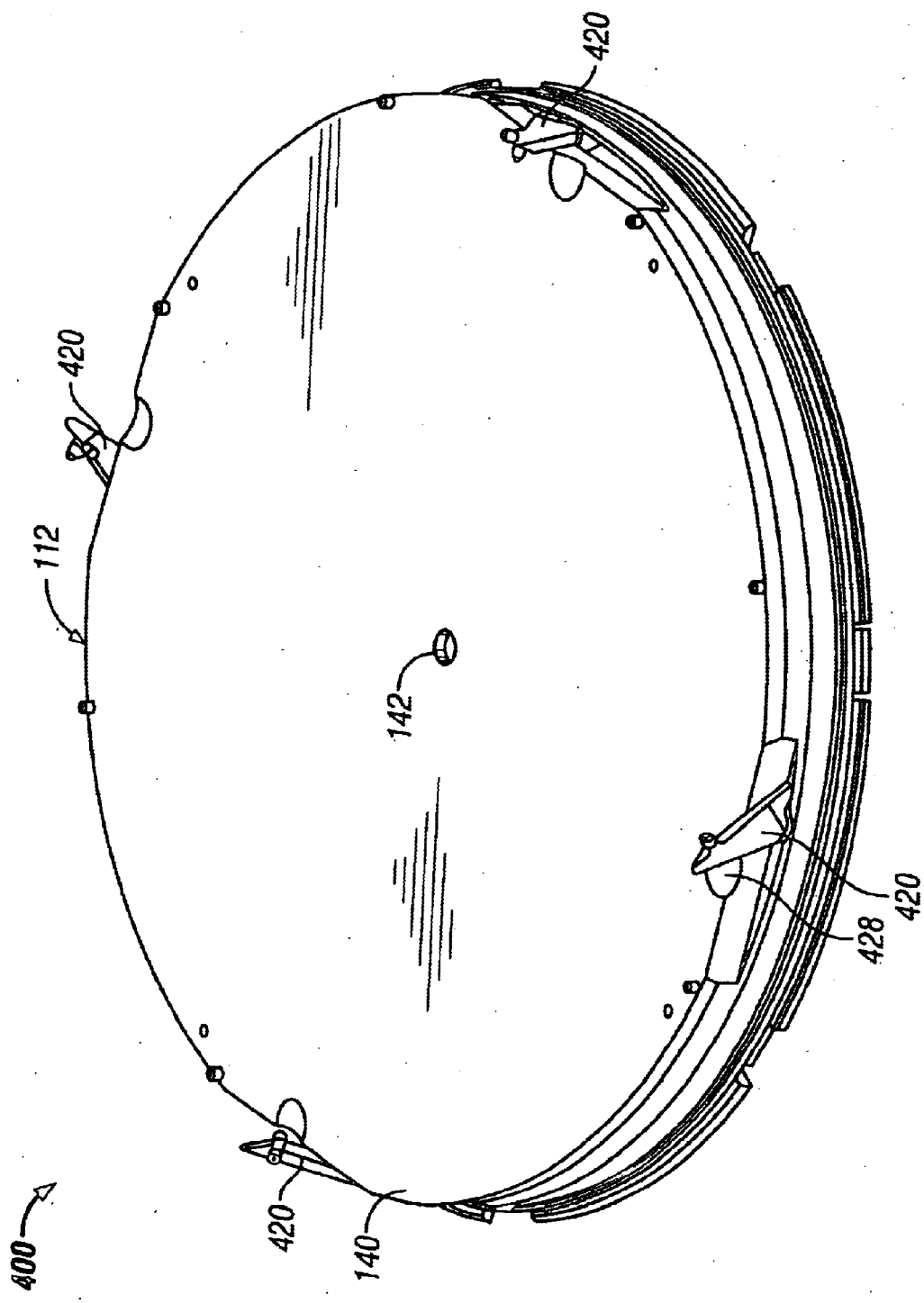
FIG. 8 is an enlarged, perspective view of a lower rotor, as shown in the reactor of FIGS. 1 and 2.

Referring to FIG. 8, the lower rotor 112 may include a lifting mechanism 400 for lifting a wafer 55 supported in the processing position to an elevated position. The lifting mechanism lifts the wafer 55 to the elevated position when the head 200 is raised above the base 300, to open or separate the upper and lower chamber walls 120 and 140. Lifting a wafer 55 to the elevated position allows it to be unloaded by a loading and unloading mechanism (not shown) such as a robotic arm.

The lifting mechanism 400 includes an array of lifting levers 420. Each lifting lever 420 is mounted pivotably to the lower chamber wall 140 via a pivot pin 422 extending into a socket 424 in the lower chamber wall 140. Each pivoting lever 420 is arranged to be engaged by the upper chamber wall 120 when the upper and lower chamber walls 120 and 140, are closed as the rotors are moved together. Each pivoting lever 420 is then pivoted into the inoperative or down position. Each lifting lever 420 is biased or spring loaded by an elastic member 440 (e.g. an O-ring) acting on a hook 425, to pivot into the operative position or up when not engaged by the upper chamber wall 120. A pin 424 on each lifting lever 420 extends beneath a wafer 55 supported in the processing position and lifts the wafer to the elevated position, when the lifting lever 420 pivots from the down position into the up position.

Figure 2:
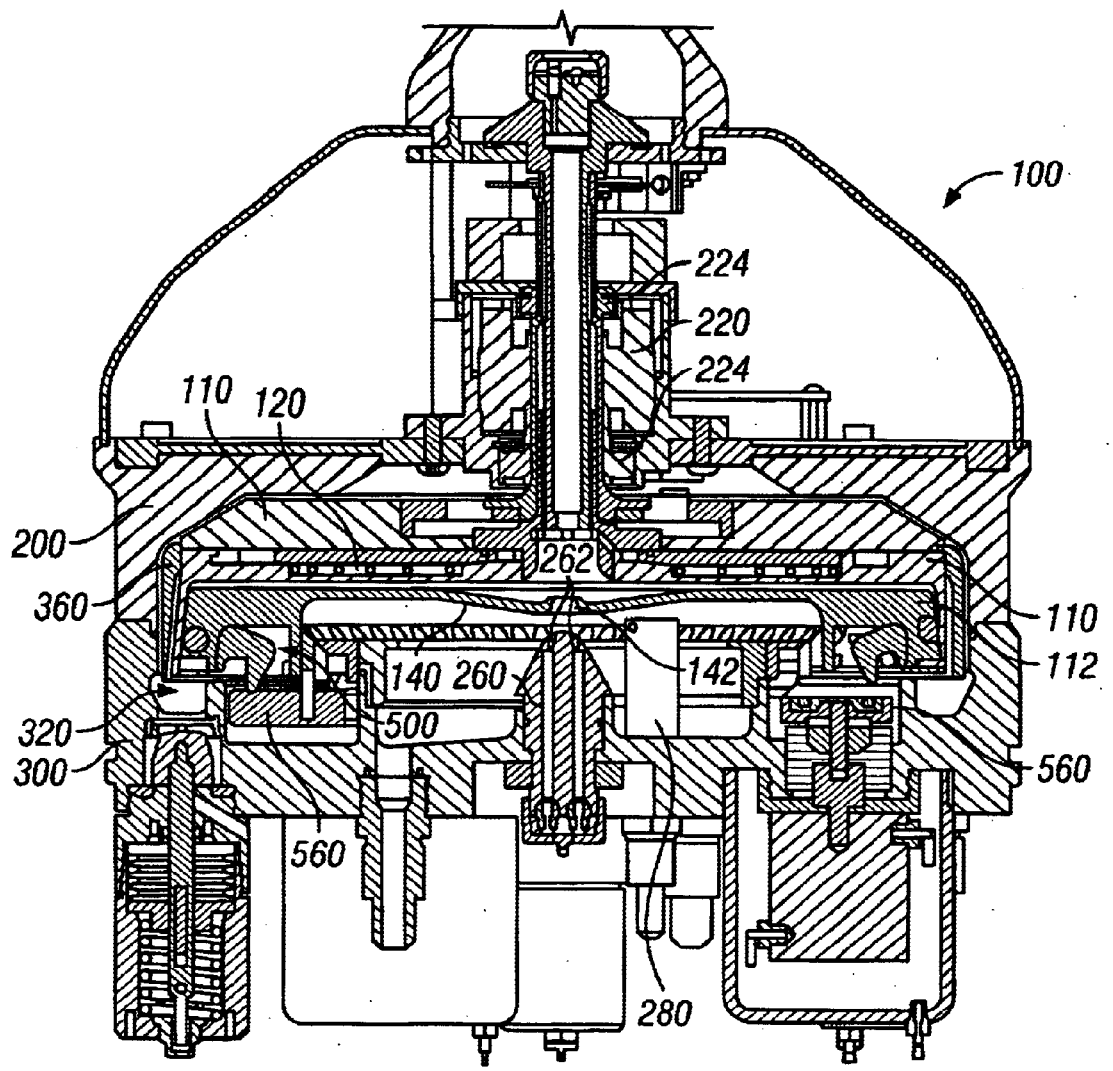
FIG. 2 is a section view of the reactor shown in FIG. 1.
Figure 4:
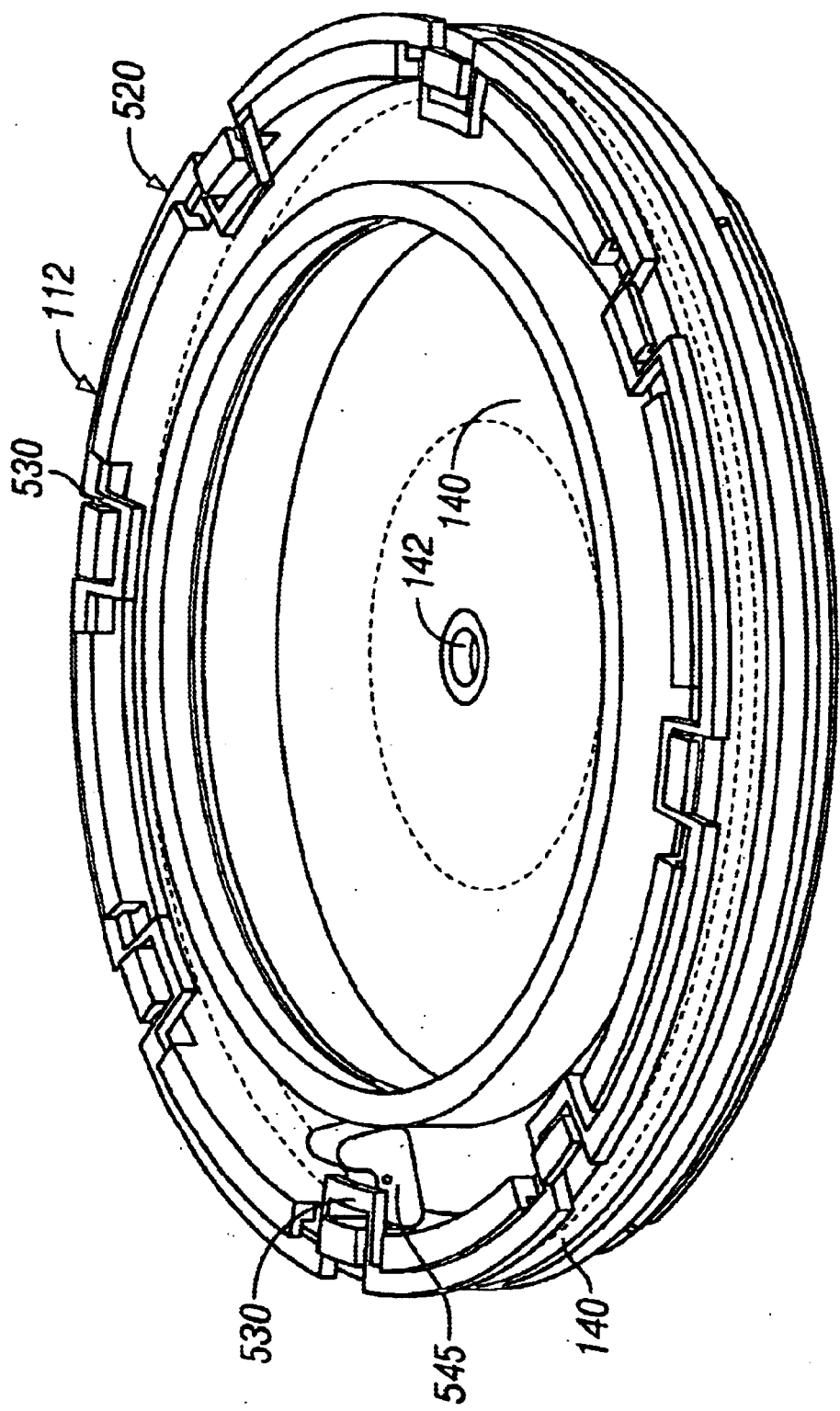
FIG. 4 is a bottom perspective view of the lower processing chamber shown in FIG. 2.
Figure 7:
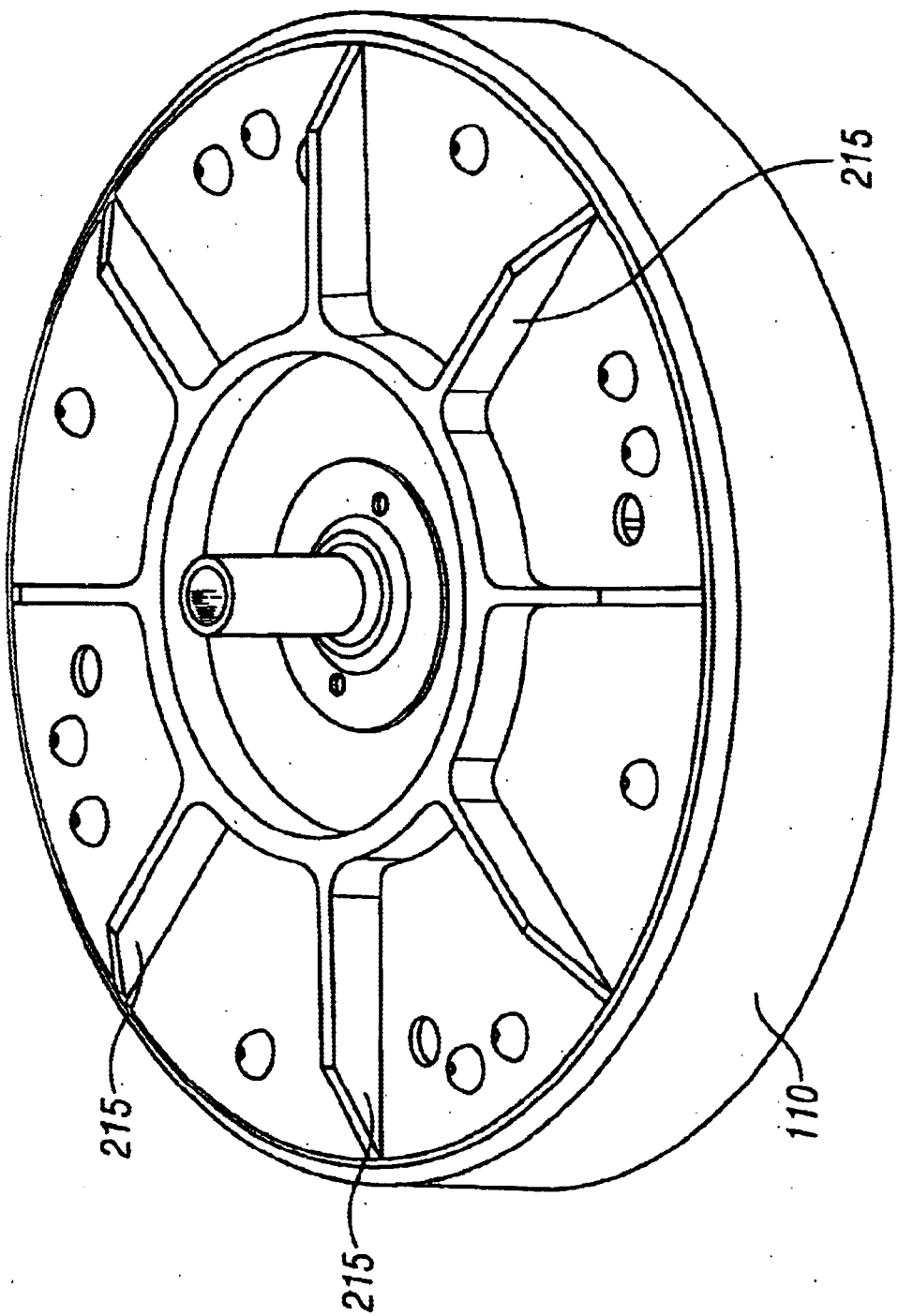
FIG. 7 is an enlarged, perspective view of the upper rotor, as shown in the reactor of FIGS. 1 and 2.

Referring momentarily to FIG. 4, the upper and lower rotors are attached to each other when in the closed position by a latching mechanism 500. As shown in FIGS. 2, 3 and 4, the latching mechanism includes a latching ring 520 that is retained on the lower rotor 112 and that is adapted to engage a complementary shaped recesses 542 disposed in the upper chamber wall 120. The latching ring 520 is made from a resilient spring material (e.g. polyvinylidine fluorid) with an array of inwardly stepped portions 530 which allow the latching ring 520 to deform from an undeformed condition in which the latching ring 520 has a first diameter into a deformed condition in which the latching ring 520 has a comparatively smaller diameter. Such deformation occurs when the stepped portions 530 are subject to radial inward directed forces. Upon removal of the forces, the latching ring 520 returns to the undeformed.

The latching mechanism 500 further includes an array of latching cams 545, each associated with a respective one of the stepped portions 530. Each latching cam 540 is adapted to apply radial forces to the respective stepped portions 530.

As shown in FIG. 2, the latching mechanism 500 further includes an actuating ring 560, which is adapted to actuating the latching cams 540 as the actuating ring 560 is raised and lowered within a predetermined limited range of movement. The actuating ring 560 is adapted, when raised, to actuate the latching cams 540, and, when lowered, to deactuate the latching cams. Pneumatic lifters 580 (e.g. three such devices) are adapted to raise and lower the actuating ring 560. When the actuating ring 560 is raised, the upper and lower chamber walls 120 and 140, are released from each other so that the head 200 can be raised from the base 300 for opening the upper and lower chamber walls 120 and 140, or lowered onto the base 300 for closing the upper and lower chamber walls 120 and 140.

As shown in FIG. 3, pins 562 on the actuating ring 560 project upwardly and into apertures 564 in an aligning ring 570, when the actuating ring 560 is raised. The aligning ring 570 is joined to, and rotates with, the lower chamber wall 140. The pins 562 are withdrawn from the apertures 564 and clear the aligning ring 570 when the actuating ring 560 is lowered. When projecting into the respective apertures 564, the pins 562 align a wafer 55 that had been supported in the processing position so as to facilitate unloading the wafer 55 via a robotic system, as mentioned above.

In use, with the rotors spaced apart, a workpiece is placed onto the lower rotor, supported by the levers 420. The rotors are then brought together. This moves the workpiece down to a processing position, where the workpiece is spaced apart from the upper and lower chamber walls 120 and 140 by only a small gap of e.g., 0.005–0.050, 0.010–0.040, 0.025–0.035 or 0.030 inches. Preferably, the processing chamber 160 is formed in the general shape of a flat workpiece, such as a semiconductor wafer or microelectronic workpiece 55 and closely conforms with the flat surfaces of the workpiece. Generally the workpiece and the gap between the upper and lower walls is about 0.030. The motor spins the rotors and the workpiece. Liquids or gases are introduced via the inlets 122 and 142. Liquids flow outwardly over the workpiece via centrifugal force. This coats the workpiece with a relatively thin liquid layer. The close spacing of the walls and the workpiece helps to provide controlled and uniform liquid flow. Gases, if used, can purge or confine vapors of the liquids, or provide chemical treatment of the workpiece as well. The spinning movement drives the fluids outwardly over the workpiece, and then out of the chamber 160 through the outlets 124. The valves 340 control release of fluids from the base 300.

Many benefits arise directly from the reduced fluid flow areas in the reactor chambers. Generally, there is a more efficient use of the processing fluids since very little of the fluids are wasted. Further, it is often easier to control the physical parameters of the fluid flow, such as temperature, volume of flow, etc., using the reduced fluid flow areas of the reactor chambers. This gives rise to more consistent results and makes those results repeatable.

Multiple sequential processes of a single workpiece can also be performed using two or more processing fluids sequentially provided through a single inlet of the reaction chamber. The ability to concurrently provide different fluids to the upper and lower surfaces of the workpiece allows for novel processing operations. For example, a processing fluid, such as HF liquid, may be supplied to a lower fluid inlet of the reaction chamber for processing the lower wafer surface while an inert fluid, such as nitrogen gas, may be provided to the upper fluid inlet. As such, the HF liquid is allowed to react with the lower surface of the wafer while the upper surface of the wafer is effectively isolated from HF reactions.

The reactor 100 can perform a wide range of functions. For example, reactor 100 can perform a process that requires complete contact of a processing fluid at a first side of a workpiece and at only a perimeter margin portion of the second side of the workpiece. Processing fluids entering the inlet 142 of the lower chamber wall 140 can act on the lower side 14 of a wafer 55. The fluids can also act on the outer perimeter 16 of the supported wafer 55, and on an outer margin 18 of the upper side 12 of the wafer 55 before reaching the outlets 124. Processing fluids entering the inlet 122 of the upper chamber wall 120 can act on the upper side 12 of the wafer 55, except for the outer margin 18 of the upper side 12, before reaching the outlets 124.

As an example, the reactor 100 can be used with control of the pressure of processing fluids entering the inlets 122 and 142, to carry out a process in which a processing fluid is allowed to contact a first side of the workpiece, the peripheral edge of the workpiece, and a peripheral region of the opposite side of the workpiece. Such fluid flow/contact can also be viewed as a manner of excluding a processing fluid that is applied to the opposite side from a peripheral region of that side. In one embodiment of such a process, a thin film of material is etched from the first side, peripheral edge of the workpiece, and peripheral region of the opposite side of the workpiece.

FIGS. 9–13 shown in alternative system having a reactor which is open on the bottom, to apply fluids to a lower surface of a workpiece using other techniques. This allows for device side down single sided processing of workpieces. The reactor may have a lower rotor which is open, to allow fluid to be applied to the bottom or device side of the workpiece, from a source external to the reactor. Alternatively, fluid can be applied through an opening in the lower rotor onto the backside of the workpiece if the workpiece is loaded device side up. A system having a reactor leaving the bottom surface of the workpiece exposed for external application of a fluid preferably includes a reactor head having an annular lower rotor. The head is in a head up position for loading and unloading, and in a head down position for processing. The head is moveable towards and away from a base. The base applies fluid to the bottom surface of the workpiece, through the open lower rotor.

Figure 9:
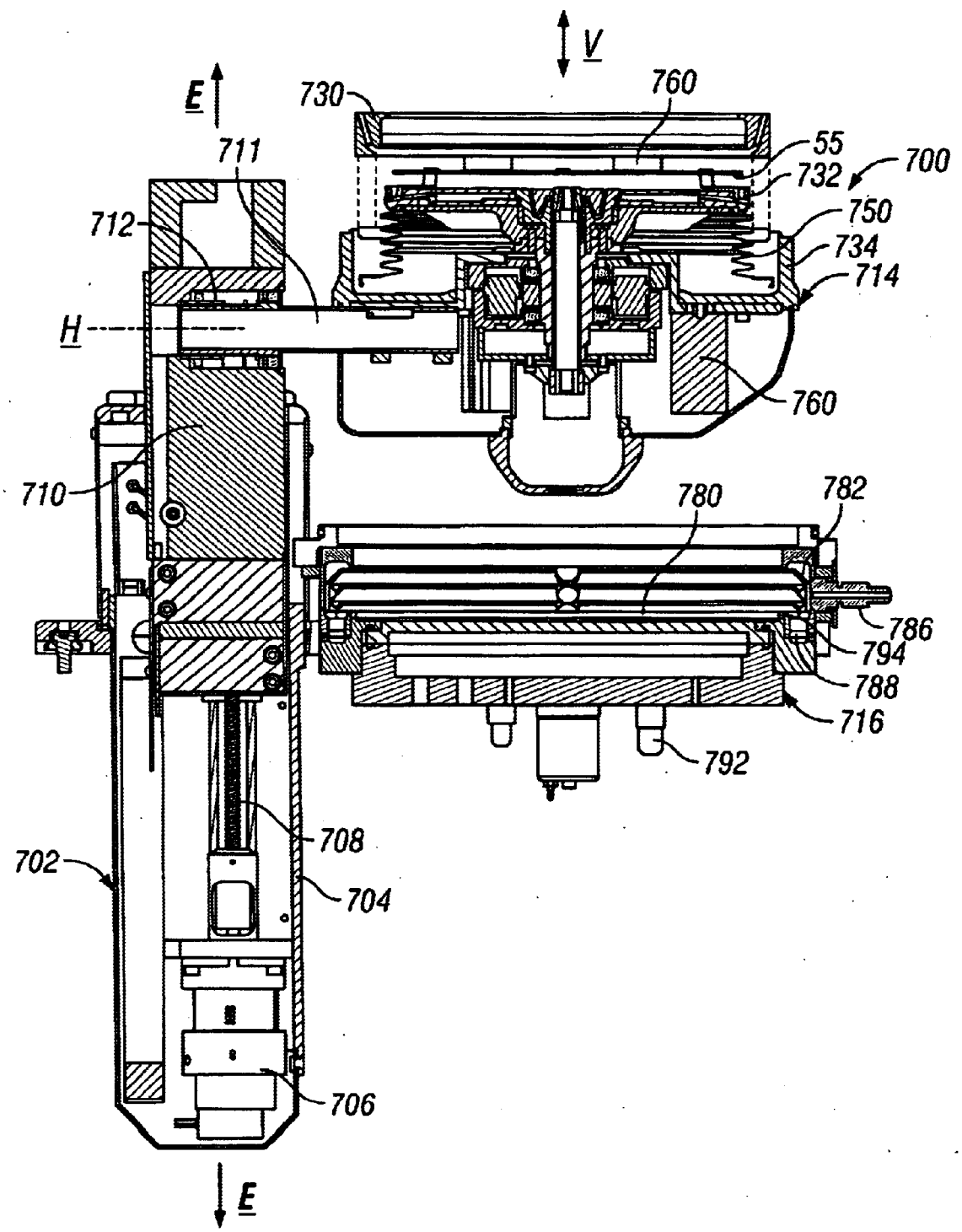
FIG. 9 is a section view of an alternative workpiece processing system shown in a head up position.

FIG. 9 shows one design, out of many possible designs, of a reactor system 700 for device side down single sided processing of a workpiece, or for external application of a fluid to a bottom surface of a workpiece. As shown in FIG. 9, the system 700 includes a process head 714 attached to a support arm 711 of an elevator or lift assembly 702. The elevator assembly 702 includes a elevator housing 704 around a lift motor 706 which turns a lead screw 708, to raise an lower an armature 710. The support arm 711 is connected to the armature 710. A support arm motor or actuator 712 in the armature 710 turns or pivots the process head 714, from the head up position, shown in FIG. 9, to a head down position, shown in FIG. 10.

Figure 10:
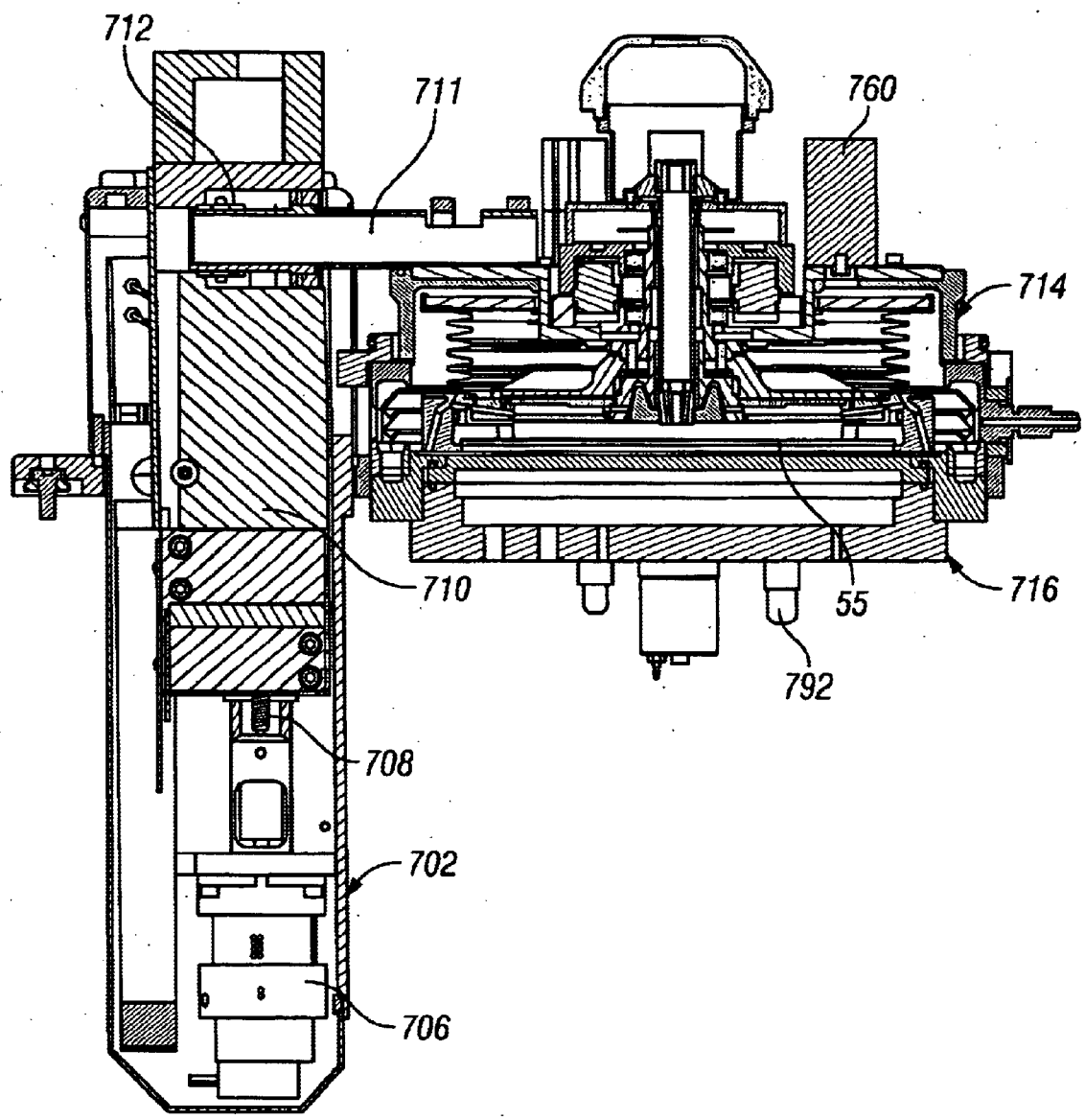
FIG. 10 is a section view of the system shown in FIG. 9, in a head down position.

Referring still to FIG. 9, a base 716 is provided below the process head 714. The base 716 includes a fluid source, for providing a fluid onto the bottom surface of the workpiece 55. The base 716 may be attached to the elevator assembly 702, or supported on the floor. The elevator assembly 702 is preferably supported on the floor. The base 716 is vertically aligned underneath the process head 714. The elevator assembly 702 moves the process head 714 towards and away from the base 716. FIG. 9 shows the process head 714 lifted away from the base 716, and with the process head 714 in the head up position, for loading and unloading a workpiece 55. FIG. 10 shows the process head 714 in the head down position, and with the process head 714 engaged with the base 16, for applying a fluid to the bottom surface of the workpiece 55.

The design shown in FIGS. 9 and 10, has the base 716 fixed onto the elevator assembly 702. The process head 714 is moveable in the vertical direction V towards and away from the base 716. The process head 714 is also pivotable about a horizontal access H. While these are the preferred relative movements between the process head 714, the elevator assembly 702, and the base 716, various other movements may also be used. For example, one or more process heads 714 may pivot about a vertical axis, such as axis E shown in FIG. 9. One or more bases 716 may be fixed or moveable, vertically, laterally, longitudinally, or pivotally or rotationally about a vertical axis. Thus, the base 716 or bases may be moveable or fixed relative to its supporting structure, such as the elevator assembly 702. Similarly, the process head 714 may be provided with other forms of movement. In addition, rather than being supported from one side by the support arm 711, the process head 714 may be supported from above, or in other ways. The process head 714 may also be supported or connected directly to the base 716, rather than to the elevator assembly 702. In addition, the head up position shown in FIG. 9, and the support arm motor 712, which provides movement between the head up and head down positions, may be omitted, with all functions, including loading and unloading performed in the head down position. Thus, FIGS. 9 and 10, while showing the preferred design, is just one of many designs contemplated by the invention.

Turning now to FIGS. 11–14, the process head or rotor 714 is similar in design and operation to the reactor shown in FIGS. 1–8 except as described below. As the process head 714 shown in FIGS. 9–14 performs processing in the head down position shown in FIG. 10, in the following description of FIGS. 11–14, the terms "above," "below," "up," or "down," and similar terms describing positions, relative to gravity, are used here in describing the system 700 with the process head 714 in the head down position. The head down position in FIG. 10 corresponds to FIGS. 13 and 14 inverted.

Figure 11:
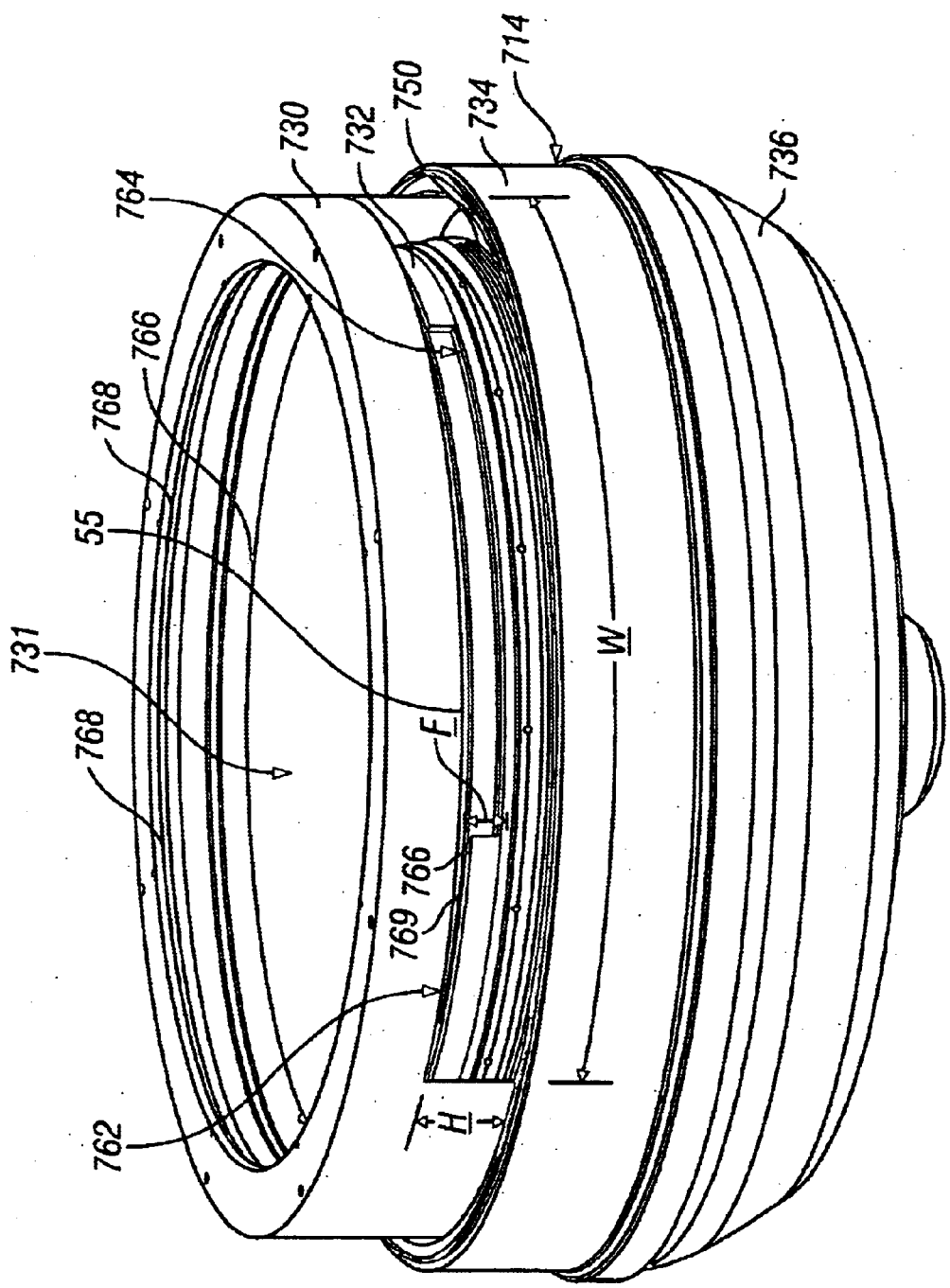
FIG. 11 is a partial perspective view of the process head shown in FIG. 9.
Figure 12:
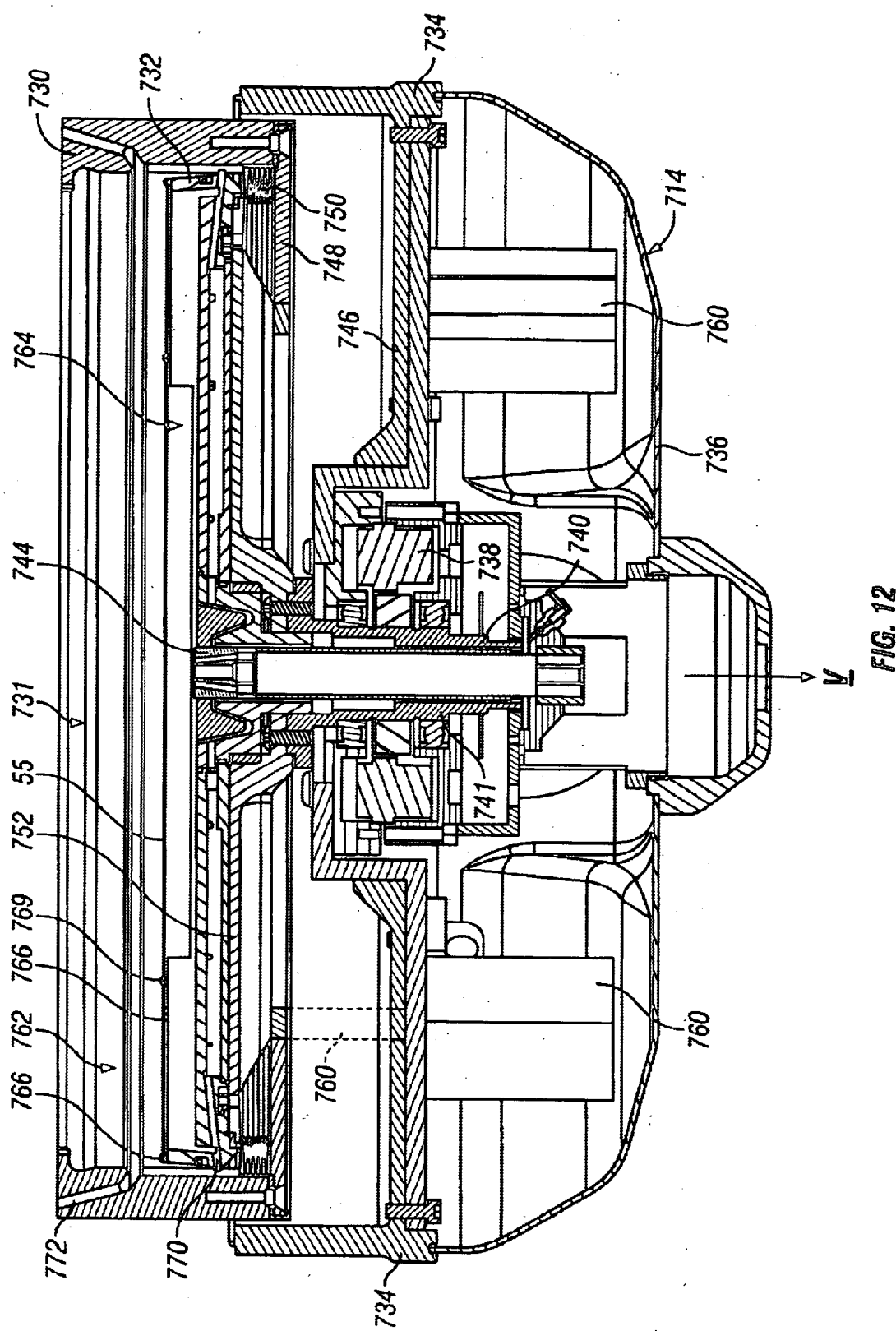
FIG. 12 is an enlarged section view of the process head shown in FIGS. 9–11, with the process head in the head up and the lower or outer rotor in an extended position, for loading and unloading a workpiece.

Referring initially to FIGS. 11 and 12, the process head 714 includes a lower or outer rotor 730 positioned around or below an upper or inner rotor 732, within a head housing 734. The upper rotor 732 is connected to a head spin motor 738 by a shaft 741. Fluids may be provided to the upper surface of the workpiece 55 via an upper nozzle 744 supplied with a fluid via supply lines extending through the tube 740, similar to the reactor of FIGS. 1–8. The motor 738 is supported on the head housing 734 by a motor plate 746, shown in FIG. 12. A head cover 736 attached to the head housing 734 covers or encloses the internal components of the process head 714.

Referring still to FIGS. 11 and 12, the lower or outer rotor 730 has a ring or annular structure. A central opening or area 731 in the lower rotor 730 allows liquid from the base 716 to be applied to the bottom surface of the workpiece 55. As shown in FIG. 12, a lower rotor ring 748 is attached to the top surface of the lower rotor 730. The lower rotor 730 is attached to and rotates with the upper rotor via the lower rotor ring. A bellows 750 is attached to the lower rotor ring 748 and to a top plate 752 of the upper rotor 732. Referring to FIG. 12, lower rotor extension actuators 760 are attached to the motor plate 746. A shaft or arm of each actuator 760 extends through an opening in the motor plate 746 and the head housing 734 and pushes on the lower rotor ring 748. Preferably, three pneumatic actuators 760 are provided, equally spaced apart on the motor plate 746. The actuators 760 move the lower rotor 730 from an extended or out position, as shown in FIGS. 11 and 12, for loading and unloading. Return springs 742, shown in FIG. 13, exert force continuously urging the lower rotor 730 into engagement against the upper rotor 732. The return springs move the lower rotor to a retracted or in position, for processing, and shown in FIGS. 13 and 14.

Referring back to FIG. 11, a load/unload opening or window 762 extends through the preferably cylindrical side wall of the lower rotor 730. A load/unload or access slot 764 is provided in the preferably cylindrical side wall of the upper rotor 732. The upper rotor 732 rotates about axis V in FIG. 12 when driven by the spin motor 738. The upper rotor 732 is otherwise preferably fixed in position relative to the head housing 734. The lower rotor 730 spins with the upper rotor 732, and is also axially moveable in the direction parallel to axis V, between the positions shown in FIGS. 11 and 12, on the one hand, and FIGS. 13 and 14, on the other. With the lower rotor 730 in the extended position, as shown in FIGS. 11 and 12, the window 762 and the lower rotor 730 extends out over, or uncovers or exposes the slot 764 in the upper rotor 732. At the slot 764, the vertical dimension or height between the workpiece 55 and the upper rotor 732, as indicated by F, is sufficient to allow an end effector or other robotic implement or tool, to move through the window 762, to lift the wafer off of the upper rotor 732. The width W of the window 762 is nominally larger than the diameter or characteristic dimension of the workpiece 55, so that the robot can withdraw the workpiece out of the process head 714 through the window 762.

The upper rotor 732 has pins or supports 766 for supporting the workpiece around its perimeter, and spaced apart from the rest of the upper rotor 732. Similarly, pins or support 768 on the lower rotor 730 extend towards the workpiece 55, to hold the workpiece 55 spaced apart from the annular structure of the lower rotor 730. With the lower rotor 730 in the extended position, shown in FIG. 11, the workpiece rests on the pins 766 of the upper rotor 732, via gravity. With the lower rotor 730 in the retracted position, as shown in FIG. 35, the workpiece 55 is secured, held, or clamped between the pins 766 and 768, while spaced apart from the other structure of the rotors. The upper rotor 732 also has guide pins 769 positioned on a circle nominally larger than the diameter of the workpiece. The guide pins 769 keep the workpiece generally centered on the upper rotor. The guide pins extend out of the upper rotor 732 to a height of 0.05–0.15 or 0.07–0.23 or 0.09–0.11 inches, and typically by about 0.1 inches. The workpiece support pins 766 have a nominal height of about 0.03 inches. Similarly, the support pins 768 on the lower rotor extend out from the lower rotor by about 0.03 inches. With a workpiece having a thickness of about 0.03 inches, there is a nominal vertical clearance of about 0.01 inches between the support pins and the workpiece, when the rotors are brought together. The guide pins 769 act as a hard stop and set the spacing between the rotors.

Figure 13:
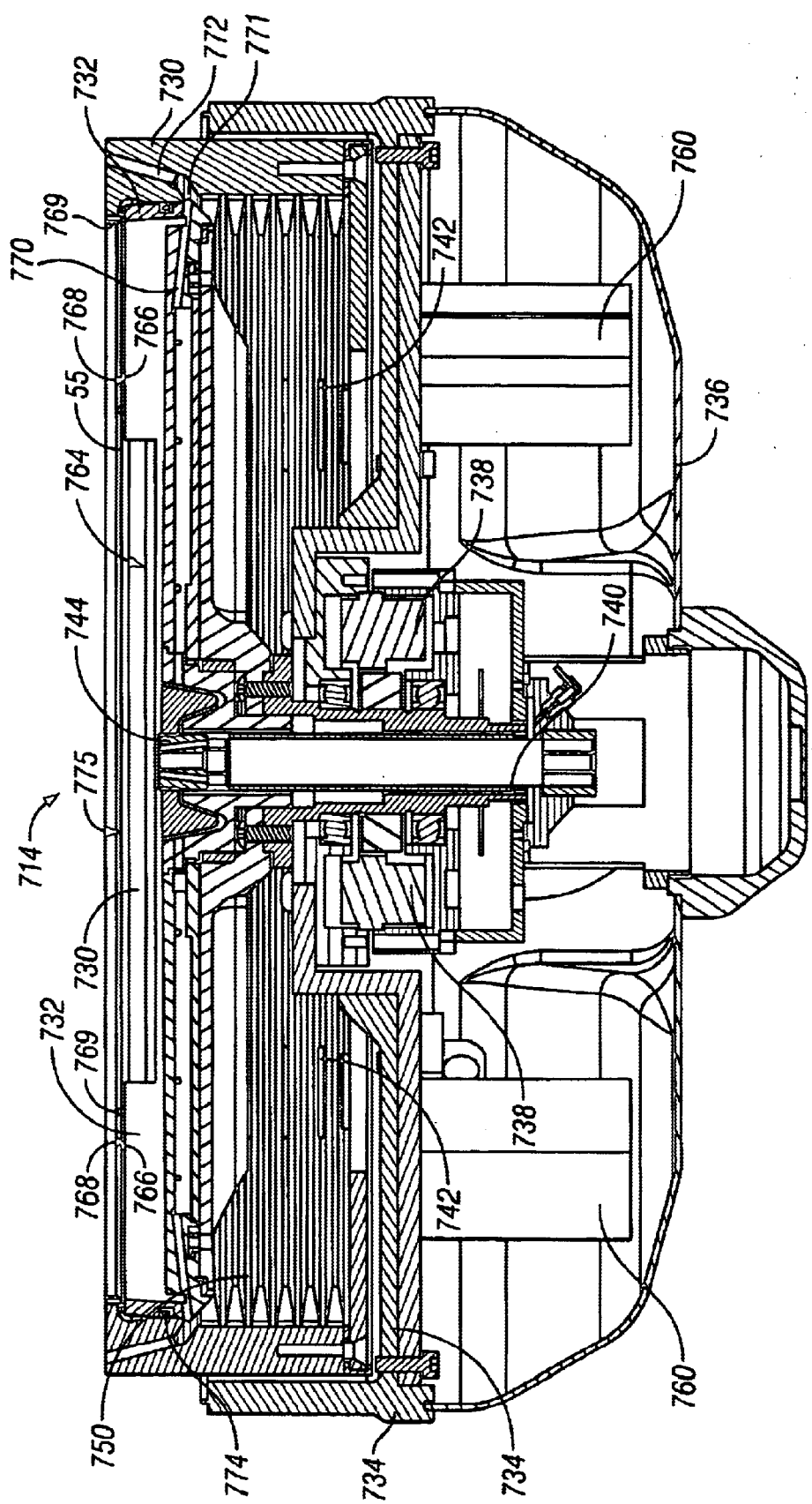
FIG. 13 is a section view thereof with the process head shown in the head up and the lower or outer rotor in a retracted position.
Figure 14:
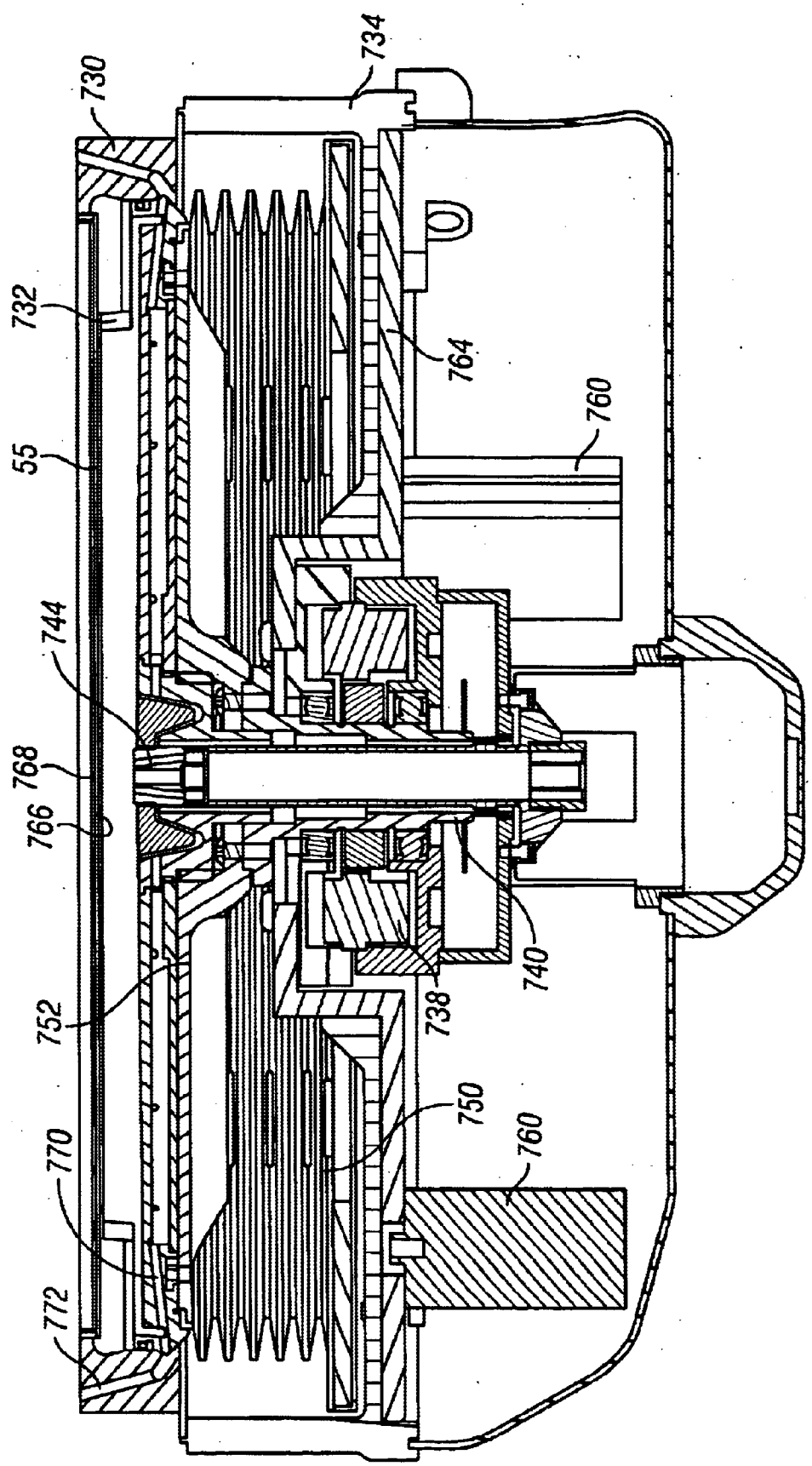
FIG. 14 is an alternative section view thereof.

With the lower rotor 730 in the retracted position shown in FIG. 13, the window 762 is moved within the head housing 734, and the slot 764 in the upper rotor 732 is covered or closed off by the solid curved side wall of the lower rotor 730.

As shown in FIG. 12, outlets 772 extend through the side walls of the lower rotor 730 from an annular channel 771 extending continuously around the lower rotor. Similarly, outlets 770 extend through the upper rotor 732. Referring to FIG. 13, with the lower rotor 730 in the retracted position, the outlets 770 connect into with the annular channel 771, providing an outlet path from the space or chamber 775 formed between the upper surface of the workpiece 55 and the lower surface of the upper rotor 732. A radial seal 774 seals the upper and lower rotors when the lower rotor moves into the process position shown in FIG. 13.

Referring back to FIG. 9, the base 716 provides a liquid onto the lower surface of the workpiece 55, through the open central area 731 of the lower rotor 730. Consequently, the base 716 may include various devices for this purpose, such as a contact or immersion type bowl, a center nozzle spray system, and an array of fixed spaced apart spray nozzles, or one or more moveable spray nozzles, such as one or more nozzles on a translating or pivoting arm. In addition, liquid outlets which facilitate liquid contact to the workpiece may be used instead of spray nozzles.

FIGS. 9 and 10 show a system 700 having a surface contact or immersion bowl or basin 780 in the base 716. Edge vanes 782 may be provided around the circumference of the bowl 780, to capture and guide liquid flowing off of or otherwise removed from the workpiece 55 during processing. A gas or liquid inlet 786 extends into the bowl 780, adjacent to the edge vanes 782, if used. Liquid inlets 792 and outlets or drains 788 provide liquid into and out of the bowl 780. Multiple inlets 792, connected to different process liquid sources may be provided.

In use, a single workpiece 55 is loaded into the process head 714. Referring to FIGS. 9, 11, and 12, in the preferred embodiment, the process head 714 is in the head up position and is elevated or lifted up and away from the base 716. The lower rotor 730 is in the extended position. A workpiece 55 is moved horizontally through the window 762 in the lower rotor 730 and through the slot 764 in the upper rotor 732. Preferably, the workpiece 55 is loaded via a robot. The height H of the slot 764 is sufficient to allow the workpiece and robot end effector to clear or fit between the pins 766 and 768. The end effector or hand of the robot can fit through the side slots or openings 762 and 764 and into the chamber 775 to load the workpiece. The workpiece 55 is lowered down (in the direction of gravity) and rests on the pins 766. The actuators 760 are de-activated, allowing the springs 742 to draw the lower rotor 730 from the extended position shown in FIG. 11, to the retracted position shown in FIG. 13. The workpiece 55 is secured between the pins 766 and 768. The edge seal ring 774, shown in FIG. 15, largely seals the upper and lower rotors together, to prevent or minimize leakage between them. With the lower rotor 730 in the retracted position, the window 762 and slot 764 are no longer aligned. The direct access entry into the chamber 775 is consequently closed off. The motor 712 moves the process head 714 from the head up position shown in FIG. 9 to the head down position shown in FIG. 10. The elevator assembly 702 moves the process head 714 into engagement with the base 716.

A process liquid is provided into the bowl 780 through the liquid inlets 792, forming a bath of liquid. With the process head 714 engaged with the base 716, the bottom surface of the workpiece 55 contacts the bath. The workpiece 55 may be fully immersed in the bath. Alternatively, only the bottom surface, or the bottom surface and workpiece edges, may be in contact with the bath. The extent of contact of the workpiece to the bath may be adjusted by varying the liquid level in the basin 780, or by varying the relative vertical positions of the process head 714 and the base 716. Preferably, the level of liquid in the bowl 780 is set via the height of a weir 794 at the sidewalls of the bowl.

The workpiece 55 may be stationary while in contact with the bath. Alternatively, the spin motor 738 may spin the workpiece, preferably at low RPM, to help facilitate movement of liquid across the workpiece surfaces. Another process vapor, gas or liquid may be provided onto the top surface of the workpiece through the upper nozzle 744. The bowl 780 may be replaced by other liquid applicators, such as fixed or moving spray nozzles or liquid outlets.

After processing with the bath of liquid is completed, the liquid in the bowl 780 is drained or removed via the drain outlets 788. The workpiece optionally may then be rotated at higher speeds, with or without additional process fluid introduced to the top surface of the workpiece by the nozzle 744. The head may lift up slightly before rotation. A gas, such as nitrogen or air, may be introduced into the base 716 by the gas inlet 786, to help remove or purge liquid from the base.

After processing is complete, the elevator assembly 702 lifts the process head 714 away from the base 716, by actuating the elevator motor 706. The support arm motor 712 returns the process head 714 back to the head up position. The extension actuators 760 move the lower rotor 730 back to the extended position. The workpiece is then removed from the process head 714.

The system 700 allows for device side down processing, to better facilitate various process steps, especially as they relate to processing semi-conductor wafers.

The amount of run out of the workpiece in the design of FIGS. 9–14 is better controlled, because the workpiece is held by the same, part that controls the edge etch zone, and has only two interfaces between the motor shaft 741 and the workpiece 55. The first interface is between the top plate and the motor shaft 741. The second interface is between the top plate and the upper rotor 732.

Figure 15:
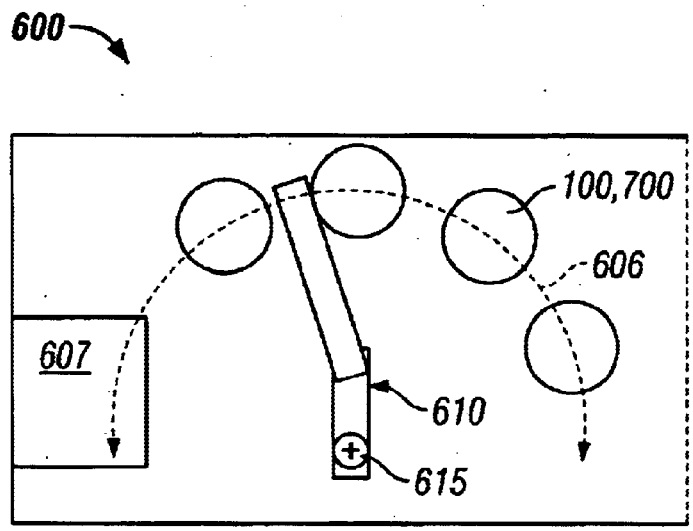
FIG. 15 is a schematic plan view of an apparatus having a semi-circular array of the systems shown in FIGS. 1–8 or in FIGS. 9–14.
Figure 16:
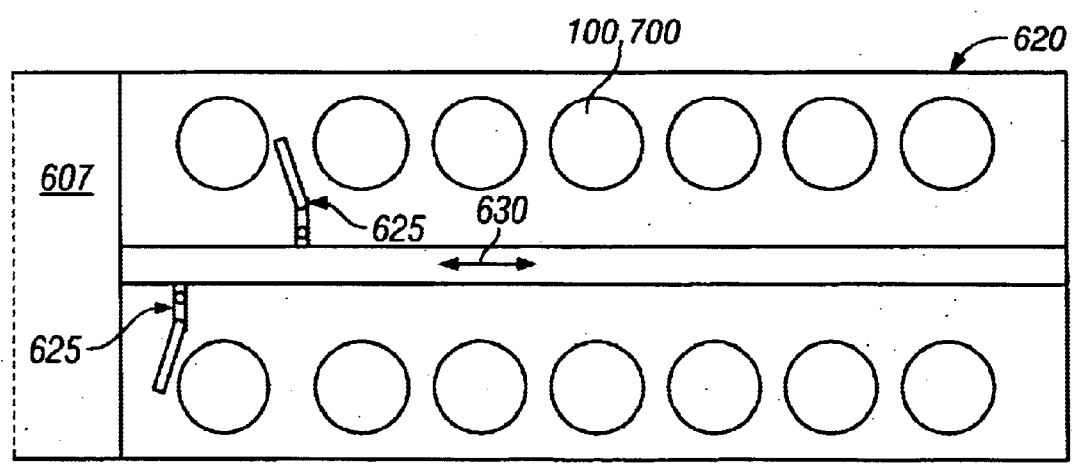
FIG. 16 is a schematic plan view of an apparatus having a linear array of the systems shown in FIGS. 1–8 or in FIGS. 9–14.

In the system 600 of FIG. 15, a robotic arm 610 rotates about axis 615 to perform the transport operations along path 606 between a load/unload station 607 and reactors 100 and/or 700. In the system 620 in FIG. 16, one or more robotic arms 625 travel along a linear path 630 to perform the required transport operations between a load/unload station 607 and reactors 100 and/or 700.

The present invention has been illustrated with respect to a wafer. However, it will be recognized that the present invention has a wider range of applicability. By way of example, the present invention is applicable in the processing of disks and heads, flat panel displays, microelectronic masks, and other devices requiring effective and controlled wet processing.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the inventions. The inventions therefore, should not be limited, except by the following claims, and their equivalents.

What is claimed is:

1. A machine for processing a workpiece, comprising:
a head having a first rotor and a second rotor around the first rotor within a head housing, with the second rotor having an open central area, and with the first rotor engageable with the second rotor to hold a workpiece between them; and
the second rotor moveable from a first position where it is adjacent to the first rotor, to a second position where the second rotor is spaced apart from the first rotor.

2. The machine of claim 1 with the second rotor and first rotor each having a chamber access opening, and with the access openings offset from each other, when the second rotor is in the first position, and with the access openings at least partially aligned with each other when the second rotor is in the second position.

3. The machine of claim 1 further comprising at least one actuator in the head for moving the second rotor from the first position to the second position.

4. The machine of claim 1 further comprising a support arm attached to the head and to a head lifter, for lifting and lowering the head.

5. The machine of claim 4 further comprising a pivot motor for pivoting the head on the support arm, from a head up position to a head down position.

6. The machine of claim 4 further comprising a base having basin, with the head lifter positioned relative to the had and base to lower at least part of the second rotor of the head into the basin.

7. The machine of claim 6 further including a sonic energy source associated with the basin.

8. The machine of claim 6 wherein the base is attached to the head lifter.

9. The machine of claim 1 further comprising an inlet in at least one of the first and second rotors.

10. The machine of claim 1 further comprising means for locking the first rotor to the second rotor.

11. The machine of claim 1 further comprising a spin motor in the head attached to at least one of the first rotor and second rotor.

12. A machine of claim 1 further comprising a bellows attached to the first rotor and the second rotor.

13. A reactor for processing a workpiece, comprising:
a reactor head housing;
a first rotor rotatably mounted within the reactor head housing;
a second rotor rotatable with the first rotor;
rotor shift means for moving the second rotor from a first position, where the first and second rotors are adjacent to each other, to a second position, where the first and second rotors are spaced apart; and
liquid applying means, separate from the reactor head, for applying liquid to a down facing surface of a workpiece supported by the first and second rotors.

14. A system for processing a workpiece comprising:
a head lifter;
a head attached to the head lifter and movable from a head up to a head down position;
a first rotor in the head having at least one workpiece support;
a base having a bowl for containing a liquid, and with the head movable by the head lifter from a first position vertically above the bowl, to a second position where the at least one workpiece support is at least partially positioned in the bowl.

15. A reactor for processing a workpiece comprising:
a first rotor having a generally circular sidewall and a first access opening in the first sidewall;
a second rotor engageable with the first rotor, and having a generally circular second sidewall, and a second access opening in the second sidewall; and
an actuator linked to at least one of the first and second rotors, for moving the first rotor from a first position, where the first and second access openings are spaced apart, to a second position where the first and second access openings are at lest partially aligned, to allow a workpiece to move through them.

16. The reactor of claim 15 further comprising a rotor housing containing at least one rotor actuator attached to the first rotor, for moving the first rotor into the first and second positions.

17. A machine for processing a workpiece, comprising:
a head lifter;
a head support on the head lifter;
a process head attached to the head support;
a process head actuator connected to the process head, for pivoting the process head about a generally horizontal axis;
a base vertically aligned under the process head;
a liquid applicator in the base for holding a bath of liquid;
a first rotor on the process head and having a first rotor access opening;
a second rotor on the process head and having a second rotor access opening moveable to engage and spin with the first rotor and moveable at least partially aligned with the first access opening with the second rotor access opening.

18. The machine of claim 17 wherein the liquid applicator comprises at least one spray nozzle.

19. The machine of claim 18 wherein the spray nozzle is positioned to spray a fluid vertically upwardly.

20. The machine of claim 19 wherein the spray nozzle is positioned on an axis of rotation of the second rotor.

21. The machine of claim 17 wherein the liquid applicator comprises a bowl for holding a bath of liquid.

22. The machine of claim 17 wherein the liquid applicator comprises a swing arm having at least one spray nozzle.

23. The machine of claim 17 wherein the liquid applicator comprises a liquid outlet of a liquid supply line.

24. A method for processing a workpiece comprising the steps of:
moving the workpiece horizontally into a process head;
inverting the process head;
lowering the process head down towards a bath of liquid, to contact at least one surface of the workpiece with the liquid;
lifting the process head up away from the bath of liquid, to remove the workpiece from the liquid; and
spinning the workpiece.

25. The method of claim 24 wherein moving the workpiece step further comprises the step of moving a second rotor relative to a first rotor on the process head, to align openings in the second and first rotors, and then moving the workpiece horizontally, through the openings.

26. An apparatus for processing a workpiece comprising:
an upper plate and a lower ring engageable onto an upper surface and a lower surface or a workpiece, respectively, with the upper plate forming an upper processing chamber over the upper surface of the workpiece;
an upper inlet extending through the upper plate for providing a fluid to the upper surface of the workpiece;
at least one fluid outlet in the upper processing chamber for removal of fluid from the processing chamber, by centrifugal force generated by rotation of the workpiece.

27. The apparatus of claim 26 where the upper plate and lower ring are supported on a process head, and where the lower ring is displaceable in a direction parallel to a rotation axis of the lower ring.

28. The apparatus of claim 27 where the upper plate is fixed in position relative to the process head.

29. The apparatus of claim 27 further comprising a head lifter attached to the process head, and base having a liquid applicator for applying a liquid to a lower surface of the workpiece, and with the process head moveable via the head lifter towards and away from the base.

30. The apparatus of claim 29 further comprising means for inverting the process head.

31. The apparatus of claim 26 wherein the upper plate has a curved upper plate sidewall with a plate access opening through it, and wherein the lower ring has a curved lower ring sidewall with a ring access opening through it, and where the upper plate and lower ring are moveable to align the plate access opening with the ring access opening.

32. The apparatus of claim 26 wherein the lower ring is positioned around the upper plate.

33. The apparatus of claim 26 where the lower ring has an open central area under a lower surface of the workpiece.

34. The apparatus of claim 26 further comprising means for applying a liquid to a lower surface of the workpiece.

35. The apparatus of claim 26 with the upper processing chamber is formed with an interstitial region between an upper surface of the workpiece and the upper plate, to closely confine processing fluids introduced into the upper processing chamber around the upper surface of workpiece.

* * * * *